US012794109B2

(12) United States Patent
Vincent et al.

(10) Patent No.: US 12,794,109 B2
(45) Date of Patent: Nov. 10, 2026

(54) ELECTRONIC DEVICES WITH SIDEWALL ANTENNAS AND METHODS OF FABRICATING SUCH DEVICES

(71) Applicant: NXP USA, Inc., Austin, TX (US)

(72) Inventors: Michael B. Vincent, Chandler, AZ (US); Richard Te Gan, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 351 days.

(21) Appl. No.: 18/582,714

(22) Filed: Feb. 21, 2024

(65) Prior Publication Data

US 2025/0266610 A1 Aug. 21, 2025

(51) Int. Cl.

| | |
|---|---|
| ***H01Q 1/22*** | (2006.01) |
| ***H01Q 1/52*** | (2006.01) |
| ***H10W 42/20*** | (2026.01) |
| ***H10W 70/65*** | (2026.01) |
| ***H10W 70/685*** | (2026.01) |
| ***H10W 74/01*** | (2026.01) |
| ***H10W 74/10*** | (2026.01) |

(Continued)

(52) U.S. Cl.

CPC ........... *H01Q 1/2283* (2013.01); *H01Q 1/526* (2013.01); *H10W 42/20* (2026.01); *H10W 70/65* (2026.01); *H10W 74/014* (2026.01); *H10W 74/473* (2026.01); *H10W 70/685* (2026.01); *H10W 74/117* (2026.01); *H10W 90/794* (2026.01)

(58) Field of Classification Search

CPC ...... H01Q 13/085; H01Q 19/30; H01Q 1/521; H01Q 21/067; H10W 44/20; H10W 74/01; H10W 74/111; H10W 95/00

See application file for complete search history.

(56) References Cited

U.S. PATENT DOCUMENTS

| | | | |
|---|---|---|---|
| 8,378,469 | B2 | 2/2013 | Gaucher et al. |
| 9,819,098 | B2 | 11/2017 | Gu et al. |

(Continued)

OTHER PUBLICATIONS

LPKF Laser & Electronics: Brochure LPKF LDS: Laser Direct Structuring for 3D Molded Interconnect Devices; downloaded from https://www.lpkfcom/fileadmin/mediafiles/user_upload/products/pdf/EQ/3D-MID-LDS/brochure_lpkf_laser_direct_structuring_en.pdf on Jan. 19, 2024; 16 pages.

(Continued)

*Primary Examiner* — Marc-Anthony Armand
(74) *Attorney, Agent, or Firm* — Sherry W. Gourlay

(57) ABSTRACT

An electronic device includes a device substrate with a mounting surface, an electronic circuit coupled to the mounting surface, and encapsulant material over the electronic circuit and the mounting surface. The encapsulant material has an upper encapsulant surface and a plurality of encapsulant sidewalls extending between the mounting surface of the device substrate and the upper encapsulant surface. The electronic device also includes a sidewall antenna coupled to one of the encapsulant sidewalls, and a shield structure embedded within the encapsulant material between the sidewall antenna and the electronic circuit. The sidewall antenna is electrically coupled to the electronic circuit through the device substrate. The shield structure extends from the mounting surface of the device substrate toward the upper surface of the encapsulant material. The sidewall antenna may be selected from an end-fire type of antenna and a broadside-fire type of antenna.

20 Claims, 4 Drawing Sheets

(51) Int. Cl.

| | |
|---|---|
| ***H10W 74/47*** | (2026.01) |
| ***H10W 90/00*** | (2026.01) |

(56) References Cited

U.S. PATENT DOCUMENTS

| | | | | |
|---|---|---|---|---|
| 2002/0167060 | A1 | 11/2002 | Buijsman et al. | |
| 2009/0184882 | A1 | 7/2009 | Jow | |
| 2015/0070228 | A1* | 3/2015 | Gu | H01Q 25/00 343/727 |
| 2016/0359221 | A1 | 12/2016 | Chih et al. | |
| 2017/0194271 | A1 | 7/2017 | Hsu et al. | |
| 2018/0053735 | A1* | 2/2018 | Ueda | H01Q 1/2283 |
| 2018/0331050 | A1 | 11/2018 | Chung et al. | |
| 2020/0259239 | A1 | 8/2020 | Moallem et al. | |
| 2020/0350180 | A1* | 11/2020 | Yen | H01Q 1/526 |
| 2021/0007214 | A1* | 1/2021 | Han | H05K 1/0216 |
| 2023/0154862 | A1* | 5/2023 | Variot | H10W 42/20 257/659 |
| 2023/0167274 | A1 | 6/2023 | Kim | |
| 2023/0275061 | A1 | 8/2023 | Chun et al. | |

OTHER PUBLICATIONS

Sumitomo Banklite Co.Ltd.: “Thermosetting Molding Compounds for 3D-circuit MID [Molded Interconnect Device] | AD/ADAS | Mobility | Solution”; downloaded from https://www.sumibe.co.jp/english/solution/mobility/AD_ADAS/thermosetting_molding_compounds.html on Jan. 19, 2024, 1 page.

* cited by examiner

ELECTRONIC DEVICES WITH SIDEWALL ANTENNAS AND METHODS OF FABRICATING SUCH DEVICES

TECHNICAL FIELD

Embodiments of the subject matter described herein relate generally to electronic devices that include antennas.

BACKGROUND

Various types of electronic systems include antennas that radiate and receive electromagnetic signals over the air. Some systems include electronic devices that include antennas and circuitry within a same device package. When antennas and circuitry are integrated within the same package, it is important to design the device so that electromagnetic signal interference associated with the antenna does not detrimentally affect the performance and proper functioning of the circuitry. Accordingly, system designers continue to develop structures and methods that make electronic systems less prone to performance degradation due to interfering electromagnetic radiation.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter described herein include antenna-in-package electronic devices that allow for good radio frequency (RF) isolation of the antennas by use of directional antennas (e.g., end-fire type antennas and/or broadside-fire type antennas) located on opposed package sidewalls to provide broadside radiation patterns. The sidewall orientation of the antennas results in radiation patterns that are directed away from the top of the device (laterally from the sidewall) in a broadside fashion, thus substantially preventing or reducing interference between antennas on opposite sidewalls of the package. Additionally, embodiments of antenna-in-package electronic devices include vertically-oriented grounded shields between the antennas and the rest of the package (e.g., circuitry between the antennas), which ground shields function to isolate radiation associated with the antenna functioning from transmitting within the package. According to one or more embodiments, a ground plane can be formed horizontally and below the antennas to act as an antenna back stop.

Figure 1:
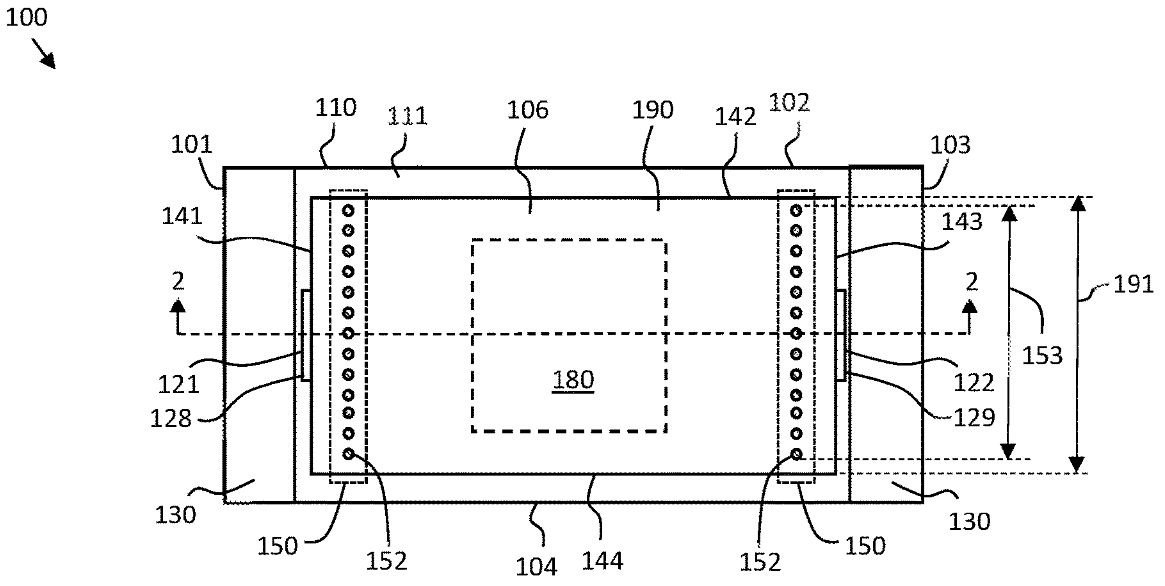
FIG. 1 is a top, external view of an antenna-in-package electronic device that includes an electronic circuit coupled to first and second sidewall antennas, in accordance with an example embodiment.

FIG. 1 is a top, external view of an antenna-in-package electronic device 100 that includes an electronic circuit 180 coupled to first and second sidewall antennas 121, 122, in accordance with an example embodiment. To enhance understanding, FIG. 1 should be viewed simultaneously with FIG. 2, which is a side, cross-sectional view (along line 2-2 of FIG. 1) and with FIG. 3, which is a side, external view of the electronic device 100 of FIG. 1.

Briefly, device 100 includes a device substrate 110 with a first substrate surface 111, a second substrate surface 112, and substantially-planar first, second, third, and fourth substrate sidewalls 101, 102, 103, 104 that extend between the first and second substrate surfaces 111, 112. The second substrate surface 112 of the device substrate 110 corresponds to a bottom surface 105 of the device 100.

In addition, device 100 includes an electronic circuit 180 coupled to the first substrate surface 111, and encapsulant material 190 covering the electronic circuit 180. The encapsulant material 190 is defined by an upper encapsulant surface 192 and substantially-planar first, second, third, and fourth encapsulant sidewalls 141, 142, 143, 144 that extend from the first substrate surface 111 to the upper encapsulant surface 192. According to one or more embodiments, the encapsulant material 190 may include a material that supports a laser direct structuring (LDS) process, as will be described in more detail in conjunction with block 810 of FIG. 8.

As will be described in detail below, planar first and second sidewall antennas 121, 122 are coupled to the encapsulant sidewalls (e.g., to sidewalls 141, 143), and are electrically coupled through the device substrate 110 to the electronic circuit 180. According to one or more embodiments, the first and second sidewall antennas 121, 122 are directional antennas. Accordingly, during system operation, the device 100 is configured to transmit RF signals with power concentrated in a first radiation pattern 187 that extends from the first sidewall antenna 121, as indicated with ovals that extend from antenna 121. Further, the device 100 is configured to have the highest sensitivity to receiving RF signals through a second radiation pattern 189 that extends from the second sidewall antenna 122, as indicated by ovals that extend from antenna 122. The transmit and receive RF signals may be processed by the embedded electronic circuit 180 (e.g., a transceiver circuit), as will be described in more detail below.

According to one or more embodiments, the electronic device 100 may be a discrete, surface-mountable device, and conductive features on the second substrate surface 112 (and thus the bottom surface 105 of device 100) may be configured to provide for physical and electrical attachment to external circuitry (e.g., to a system substrate, not shown, associated with a radar or communications system). Accordingly, the second substrate surface 112 may be referred to herein as a "terminal surface" of the device 100. According to an embodiment, a plurality of conductive device terminals (e.g., terminals 160, 161, 166, FIG. 2) are exposed at the terminal surface 105, 112, and these device terminals facilitate communication of electrical signals and voltages between circuitry within the device 100 (e.g., electronic circuit 180) and the external circuitry (not shown). More specifically, the device terminals at the terminal surface 105, 112 may be aligned with corresponding terminals (not shown) on a system substrate (not shown), and the device terminals and the system substrate terminals may be physically and electrically connected using conductive attachment material (e.g., solder balls 170, FIG. 2). Accordingly, device 100 essentially is a surface-mountable, ball grid array (BGA) type of device. In other embodiments, a different type of electronic and mechanical interface may be used to connect the device 100 to a system substrate (e.g., device 100 may be a land grid array (LGA), a pin grid array (PGA) device, or have another type of interconnect structure).

Figure 2:
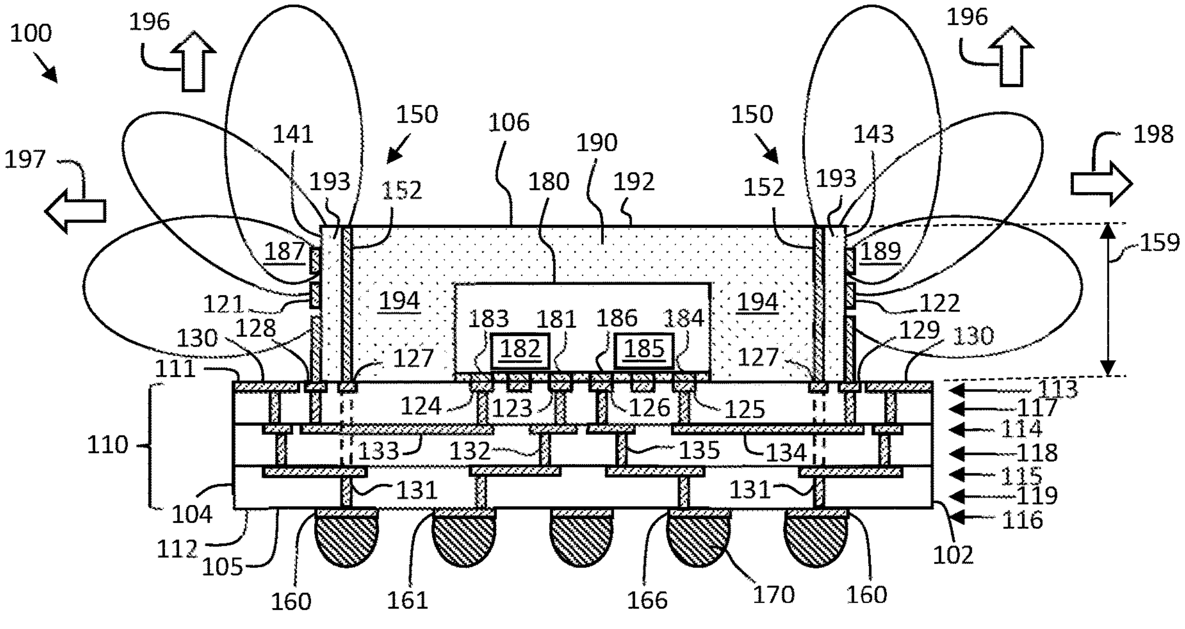
FIG. 2 is a side, cross-sectional view of the electronic device of FIG. 1 or FIG. 4 along line 2-2.

The device substrate 110 may, in various embodiments, take the form of a redistribution layer (RDL) structure, a multiple-layer printed circuit board (PCB) or another suitable structure. Regardless of the form it takes, the device substrate 110 includes multiple conductive layers 113, 114, 115, 116 (FIG. 2) separated by multiple dielectric layers 117, 118, 119 (FIG. 2). In the below description, each of the conducive layers 113-116 may be referred to as a "patterned" conductive layer, meaning that the conductive layer may include multiple conductive features that are separated by non-conductive gaps. The use of the term "patterned" is not meant to limit how the conductive features of the conductive layer are formed. The conductive features may be formed by a subtractive process (e.g., blanket deposit the conductive layer and subsequently remove conductive material to create non-conductive gaps) or by an additive process (e.g., by printing the conductive features).

A first patterned conductive layer 113 is referred to herein as an "upper" conductive layer, a fourth patterned conductive layer 116 is referred to herein as a "lower" conductive layer, and second and third patterned conductive layers 114, 115 are referred to herein as "intermediate" conductive layers. Conductive vias (not numbered), may extend through the dielectric layers 117-119 to connect various sets of conductive features within adjacent conductive layers 113-116. Although four conductive layers 113-116 and three dielectric layers 117-119 are depicted in the drawings, alternate embodiments of a routing structure may include more or fewer conductive and dielectric layers.

According to some embodiments, the upper conductive layer 113 of the device substrate 110 includes a plurality of conductive features on or exposed at the mounting surface 111 of the device substrate 110. For example, the upper conductive layer 113 may include conductive features in a roughly central portion of the upper surface 111 that correspond to conductive circuitry pads (e.g., pads 123, 124, 125, 126, FIG. 2) to which an electronic circuit 180 is physically and electrically coupled, as will be described in more detail below. Portions of the upper conductive layer 113 also may provide additional conductive structures. For example, the upper conductive layer 113 may include conductive ground pads 127 that are configured to be coupled to first and second shield structures 150 (described below), and may include conductive antenna pads 128, 129 configured to be coupled to first and second antennas 121, 122 (also described below), respectively. In addition, patterned portions of the upper conductive layer 113 may form conductive antenna ground planes 130 (also described below).

The one or more intermediate conductive layers 114, 115 may function as routing layers that facilitate electrical connection between features of the upper conductive layer 113 (e.g., pads 123-129 and antenna ground planes 130) and device terminals (e.g., terminals 160, 161, 166) formed from portions of the lower conductive layer 116 at the second substrate surface 112 (and thus at the terminal surface 105 of the device 100). Although two intermediate conductive layers 114, 115 are shown in FIG. 2, more or fewer intermediate conductive layers may be included, in other embodiments.

The lower conductive layer 116 may provide the above-mentioned conductive device terminals 160, 161, 166. According to one or more embodiments, some of the device terminals 160 are configured to be coupled to ground (or to another voltage reference) of a larger electrical system, and thus the device terminals 160 may be referred to herein as "ground terminals." For example, according to one or more embodiments, the above-mentioned antenna ground planes 130 and the ground pads 127 are electrically coupled through conductive routing paths 131 to the ground terminals 160 at the terminal surface 105 of the device 100. This enables the ground pads 127 and the antenna ground planes 130 to be grounded during system operation.

Other ones of the device terminals 161, 166 are configured as input/output (I/O) terminals, which are configured to be coupled to signal inputs from the larger electrical system or to signal outputs to the larger electrical system. This enables the device 100 to receive input signals from and provide output signals to the larger electrical system. Still other ones of the device terminals (not numbered) are configured as control or bias terminals.

As mentioned above, device 100 also includes circuitry coupled to the upper substrate surface 111. Accordingly, the upper substrate surface 111 of the device substrate 110 may be referred to as a "mounting surface." As will be described in more detail below, the circuitry coupled to the mounting surface 111 of the device substrate 110 includes an electronic circuit 180, which is embedded within the above-mentioned encapsulant material 190. The upper surface 192 of the encapsulant material 190 corresponds to the upper surface 106 of the device 100. Again, substantially-planar first, second, third, and fourth encapsulant sidewalls 141, 142, 143, 144 extend from the mounting surface 111 of the device substrate 110 to the upper encapsulant surface 192. In some embodiments, the substantially-planar first, second, third, and fourth encapsulant sidewalls 141-144 may be oriented in parallel planes to the substantially-planar first, second, third, and fourth substrate sidewalls 101-104, respectively. In other embodiments, the encapsulant sidewalls 141-144 and the substrate sidewalls 101-104 may be oriented in non-parallel planes.

Figure 3:
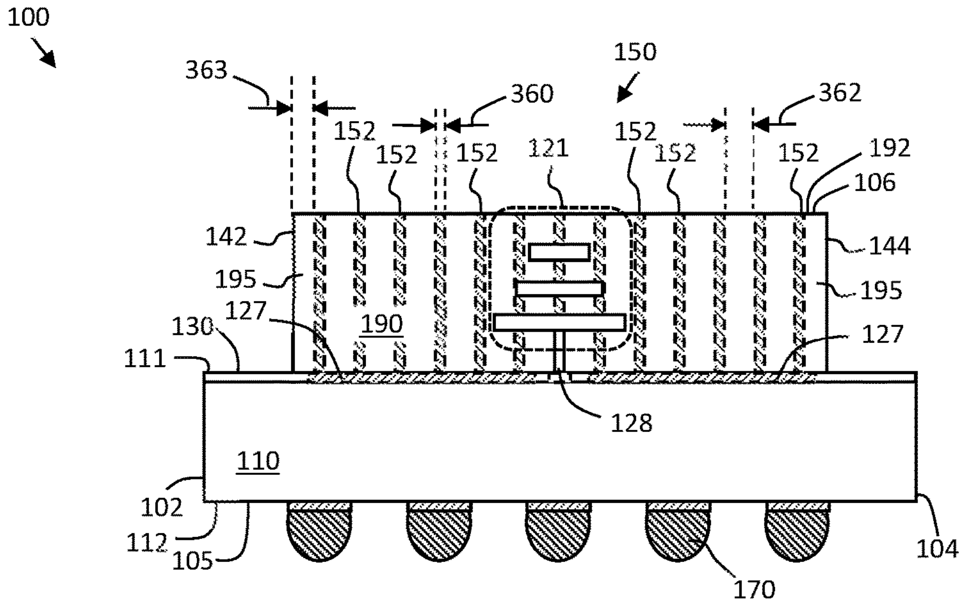
FIG. 3 is a side, external view of the electronic device of FIG. 1, in accordance with an example embodiment.

Device 100 also includes first and second sidewall antennas 121, 122 coupled to at least two of the encapsulant sidewalls 141-144 (e.g., to encapsulant sidewalls 141 and 143, as shown in FIGS. 1-3). In the illustrated embodiments, the first sidewall antenna 121 is coupled to the first encapsulant sidewall 141, and the second sidewall antenna 122 is coupled to the third encapsulant sidewall 143, which is parallel to but on the opposite side of the device 100 from the first encapsulant sidewall 141. During operation of the device 100, the first sidewall antenna 121 is used to transmit RF signals, and thus, the first sidewall antenna 121 may be referred to herein as a "transmit antenna." The second sidewall antenna 122 is configured to receive RF signals, and thus, the second sidewall antenna 122 may be referred to herein as a "receive antenna." Encapsulant sidewalls 141, 143 may be considered to be "radiation surfaces" of the device 100, because the sidewall antennas 121, 122 on those sidewalls 141, 143 are configured to radiate and/or receive radio frequency (RF) signals at the sidewalls 141, 143.

Although the embodiments described herein include one transmit antenna 121 coupled to the first sidewall 141 of the device 100, and one receive antenna 122 coupled to the opposed, third sidewall 143 of the device 100, other configurations are intended to be encompassed by the inventive subject matter. For example, in other embodiments, both transmit and receive antennas may be coupled to a same encapsulant sidewall (e.g., one or more transmit antennas and one or more receive antennas may be coupled to any one or more of sidewalls 141-144). In still other embodiments, multiple transmit or receive antennas may be coupled to an encapsulant sidewall (e.g., multiple transmit antennas or multiple receive antennas may be coupled to any one or more of sidewalls 141-144). In still other embodiments, rather than having antennas coupled to exactly two encapsulant sidewalls, as shown in the figures, one or more transmit and/or one or more receive antennas may be coupled to only one of the encapsulant sidewalls (e.g., only to sidewall 141), or alternatively, transmit and/or receive antennas may be coupled to three or four of the encapsulant sidewalls (e.g., to sidewalls 141-143). In still other embodiments, antennas may be coupled to adjacent encapsulant sidewalls, in addition to or instead of being coupled to opposed sidewalls.

According to one or more embodiments, the first and second sidewall antennas 121, 122 are directional antennas. In some embodiments, the transmit and receive antennas 121, 122 are characterized by substantially upwardly-extending radiation patterns 187, 189. As used herein, "upwardly" means that the main lobes of the radiation patterns 187, 189 extend from the antennas 121, 122 beyond the upper surface 192 of the encapsulant material 190 in a direction that is substantially parallel to the encapsulant sidewalls 141, 143, as indicated by arrows 196. More specifically, the power of the RF signals that are transmitted by the transmit antenna 121 is strongest in a substantially upwardly-extending direction encompassed by radiation pattern 187. Conversely, the receive antenna 122 is configured to have a highest sensitivity to RF signal power from other sources in a direction encompassed by radiation pattern 189. Said another way, the sensitivity as a function of direction of the receive antenna 122 is highest within a substantially upwardly-extending radiation pattern 189. According to such embodiments, as will be described in more detail in conjunction with FIG. 6, the transmit and receive antennas 121, 122 may include planar, end-fire types of antennas that are characterized by the above-described, upwardly-extending radiation patterns 187, 189.

According to one or more alternate embodiments, the transmit and receive antennas 121, 122 may be characterized by substantially laterally-extending radiation patterns (not shown), where "laterally," as used herein, means that the main lobes of the radiation patterns extend from the antennas 121, 122 in opposite directions that are substantially perpendicular to the encapsulant sidewalls 141, 143. More specifically, the power of the RF signals that are transmitted by the transmit antenna 121 is strongest in a substantially laterally-extending direction indicated by arrow 197. Conversely, the receive antenna 122 is configured to have a highest sensitivity to RF signal power from other sources in an opposite, substantially laterally-extending direction indicated by arrow 198. Said another way, the sensitivity as a function of direction of the receive antenna 122 is highest within a substantially laterally-extending radiation pattern. According to such embodiments, the transmit and receive antennas 121, 122 may include planar, broadside-fire types of antennas that are characterized by the above-described, laterally-extending radiation patterns, as will be described in more detail in conjunction with FIG. 8.

According to an embodiment, at least some of the encapsulant sidewalls 141-144 are recessed or set back from the substrate sidewalls 101-104 with which they are oriented in parallel planes (e.g., encapsulant sidewall 141 is recessed from substrate sidewall 101, encapsulant sidewall 143 is recessed from substrate sidewall 103, and so on). Such a configuration results in portions of the mounting surface 111 being exposed between at least some of the encapsulant sidewalls 141-144 and at least some of the substrate sidewalls 101-104. According to one or more embodiments, substantially-planar, horizontally-oriented, first and second antenna ground planes 130 are provided at or below the mounting surface 111 in the exposed portions of the mounting surface 111 between encapsulant sidewall 141 and substrate sidewall 101, and between encapsulant sidewall 143 and substrate sidewall 103. The antenna ground planes 130 are oriented perpendicular to the encapsulant sidewalls 141, 143 to which they are adjacent. The antenna ground planes 130 are configured, during operation of device 100, to act as an antenna back stop, and thus to shield the device substrate 110 from electromagnetic radiation produced by sidewall antenna 121, and from electromagnetic radiation that impinges upon sidewall antenna 122. Further, the antenna ground plane 130 that is adjacent to the sidewall antenna 121 is configured to reflect signals produced by the sidewall antenna 121 in a generally upward direction. Further still, the antenna ground plane 132 that is adjacent to the sidewall antenna 122 is configured to reflect electromagnetic radiation that impinges on the ground plane 130 upward toward the sidewall antenna 122. Any such energy is conveyed from the antenna ground planes 130 through the device substrate 110 (e.g., through routing paths 131) to the ground terminals 160. Accordingly, potential interference from the transmit and receive RF signals within the radiation patterns 187, 189, which may otherwise impinge upon the device substrate 110, is reduced or substantially eliminated through the inclusion of the antenna ground planes 130.

As best seen in FIG. 1, the antenna ground planes 130 may be electrically separated from (isolated from) the antenna pads 128, 129 (and thus from the antennas 121, 122) by virtue of non-conductive gaps in the upper conductive layer 113. The antenna ground planes 130 may substantially cover all portions of the upper substrate surface 111 between the antenna pads 128, 129 (and the antennas 121, 122) and the substrate sidewalls 101, 103, extending also to sidewalls 102 and 104. During operation of the device 100, this configuration may substantially prevent the electromagnetic energy emanating from the transmit antenna 121 or being received by the receive antenna 122 from being conveyed into the device substrate 110. In alternate embodiments (not illustrated), some or all of the encapsulant sidewalls 141-144 may be co-planar with the substrate sidewalls 101-104, and the antenna ground planes 130 may be excluded.

According to one or more embodiments, the electronic device 100 also includes vertically-oriented, first and second shield structures 150 embedded in the encapsulant material 190 behind the sidewall antennas 121, 122 (i.e., between the sidewall antennas 121, 122 and the electronic circuit 180). The shield structures 150 extend in a perpendicular direction from the mounting surface 111 of the system substrate 110 toward (or to) the upper encapsulant surface 192. The shield structures 150 are configured, during operation of device 100, to shield the embedded electronic circuit 180 within the device 100 from electromagnetic radiation produced by sidewall antenna 121, and from electromagnetic radiation that impinges upon sidewall antenna 122. The shield structures 150 may convey any such energy from the shield structures 150 through the device substrate 110 (e.g., through routing paths 131) to the ground terminals 160.

Accordingly, potential interference from the transmit and receive RF signals within the radiation patterns 187, 189, which may otherwise affect the operation or performance of the electronic circuit 180, is reduced or substantially eliminated through the inclusion of the shield structures 150.

First portions 193 (FIG. 2) of encapsulant material 190 are present between the shield structures 150 and the encapsulant sidewalls 141, 143, and second portions 194 (FIG. 2) of the encapsulant material 190 are present between the shield structures and the electronic circuit 180.

As most clearly seen in FIGS. 1 and 3, according to one or more embodiments, the shield structures 150 may be implemented as a plurality of conductive vias 152 (or conductive posts) that have proximal ends coupled to the ground pads 127 at the mounting surface 111 of the device substrate 110, and distal ends that extend towards or to the upper encapsulant surface 192. The conductive vias 152 may be arranged along a straight line between encapsulant sidewalls 142 and 144, thus forming a row as shown in FIG. 1. In other embodiments, adjacent ones of the conductive vias 152 may be offset from each other (e.g., the vias 152 may be arranged in a zigzag, sinusoidal, sawtooth, or other pattern between encapsulant sidewalls 142 and 144). In still other embodiments, multiple rows of conductive vias 152 may be implemented. Regardless of the arrangement of the conductive vias 152, the lateral sides of each of the conductive vias 152 are surrounded by the encapsulant material 190, in some embodiments.

The cumulative length 153 (FIG. 1) of the set of conductive vias 152 that make up each shield structure 150 may be slightly shorter than the width 191 (FIG. 1) of the encapsulant material 190 between sidewalls 142 and 144 so that third portions 195 (FIG. 3) of the encapsulant material 190 are present between the lateral sides of the outermost (leftmost and rightmost, in FIG. 3) conductive vias 152 and encapsulant sidewalls 142, 144, which are adjacent to the encapsulant sidewalls 141 and 143. For example, the cumulative length 153 of each shield structure 150 may be in a range of about 400 microns to about 4000 microns.

According to one or more embodiments, a width 363 (FIG. 3) of the third portions 195 of the encapsulant material 190 may be selected to avoid a potential phenomenon of signal energy from the antennas 121, 122 reflecting inward from the encapsulant sidewalls 142, 144 through the space between the encapsulant sidewalls 142, 144 and the lateral sides of the outermost conductive vias 152. For example, the selected width 363 may be in a range of about lambda/16 to about lambda/8 (i.e., less than or equal to lambda/8), where lambda is the wavelength associated with the frequency of operation of the device 100, or the lower bandwidth limit. In general, when a signal waveform strikes an interface between two materials with different physical properties, some of the waveform energy may be reflected, and the rest may be transmitted through the interface. By selecting a width 363 that is a fraction of the wavelength, any reflected waveform energy is prevented from bypassing the conductive vias 152.

In addition, adjacent vias 152 within each shield structure 150 are separated from each other by an inter-via spacing 362 (FIG. 3), that is filled with the encapsulant material 190. For example, the inter-via spacing 362 may be in a range of about 100 microns to about 1000 microns, although the inter-via spacing 362 may be smaller or larger, as well. The inter-via spacing 362 may be selected based on the frequency or bandwidth of operation of the device 100. More particularly, the inter-via spacing 362 may be selected to block signal energy from traveling from the transmit and receive antennas 121, 122 toward the electronic circuit 180. For example, the selected inter-via spacing 362 may be in a range of about lambda/16 to about lambda/8 (i.e., less than or equal to lambda/8), where lambda is the wavelength associated with the frequency of operation of the device 100, or the lower bandwidth limit. Again, by restricting the inter-via spacing 362 to a fraction of the wavelength of the signal waveform, the conductive vias 152 may block waveform energy from reaching the embedded electronic circuit 180.

According to one or more embodiments, the heights 159 of the conductive vias 152 within the shield structures 150 are at least as high as the height (not numbered) of the electronic circuit 180 (or at least those components of the electronic circuit 180 that are susceptible to electromagnetic interference). Further, in some embodiments, the heights 159 of the conductive vias 152 may be about equal to the height (not numbered) of the encapsulant material 190. In some embodiments, the distal ends of the vias 152 are exposed at the upper encapsulant surface 192 (and thus exposed at the upper surface 106 of the device 100). In other embodiments, the heights 159 of the conductive vias 152 may be less than the height of the encapsulant 190, although not significantly less to avoid a potential phenomenon of signal energy from the antennas 121, 122 reflecting downward from the interface associated with the upper encapsulant surface 106 through the space between the upper encapsulant surface 106 and the tops of the conductive vias 152. For example, the maximum difference in the heights of the encapsulant 190 and the vias 152 may be selected dependent on the bandwidth or frequency of operation of the device 100 (e.g., the maximum difference in height may be less than lambda/8, where lambda is the wavelength associated with the frequency of operation of the device 100, or the lower bandwidth limit).

In the embodiment of FIG. 1, each conductive via 152 has a substantially circular cross-sectional shape. Accordingly, a height 159 of each via 152 is significantly greater (e.g., from 5 to 50 times greater) than its diameter (e.g., diameter 360, FIG. 3). For example, but not by way of limitation, each conductive via 152 may have a height 159 in a range of about 20 microns to about 2000 microns. In other embodiments, the heights 159 may be smaller or larger than the above-given range. Further, the diameter 360 (FIG. 3) of each via 152 may be in a range of about 20 microns to about 200 microns, although the diameter 360 may be smaller or larger, as well.

In various embodiments, as will be described in more detail later in conjunction with FIG. 8, each conductive via 152 may include a conductive pillar (e.g., pillar 152, step 804, FIG. 8) that is built up upon or attached to the mounting surface 111 of the device substrate 110 (and more specifically to a ground pad 127). The encapsulant material 190 may then be applied over the mounting surface 111 of the device substrate 110. In other embodiments, each conductive via 152 may consist of an elongated hole in the encapsulant material 190 that is lined or filled with conductive material.

Figure 4:
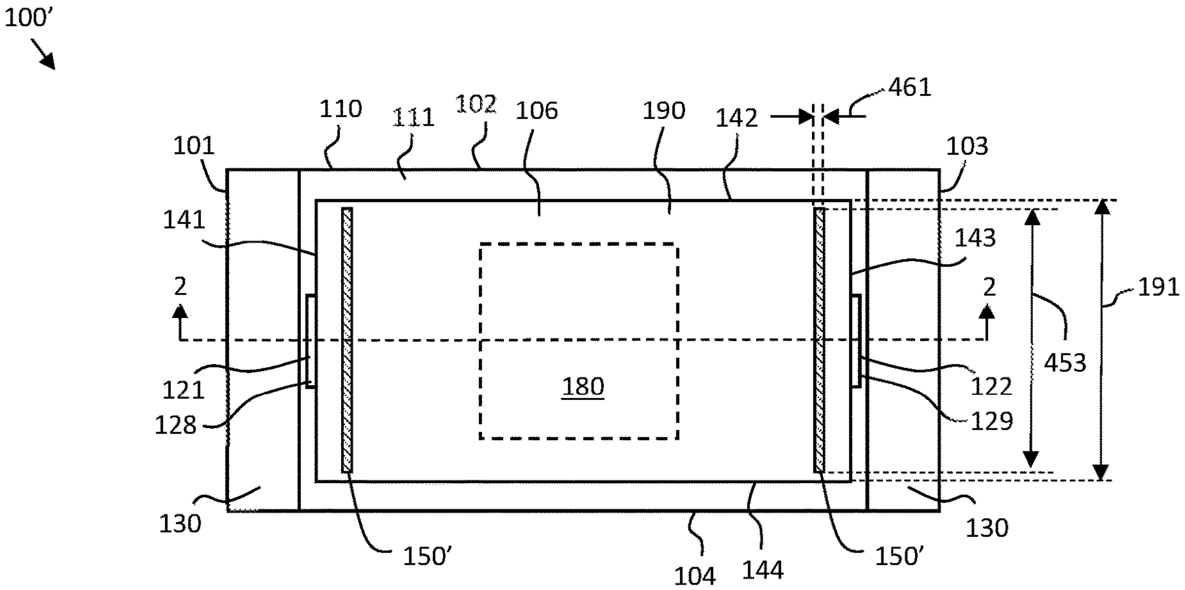
FIG. 4 is a top, external view of an antenna-in-package electronic device, in accordance with another example embodiment.
Figure 5:
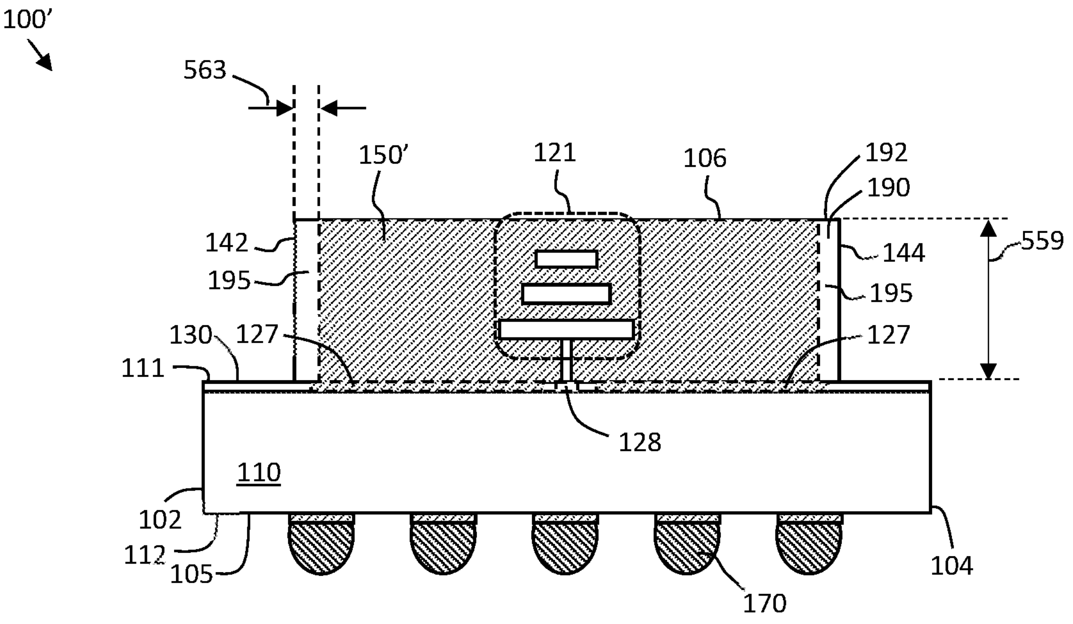
FIG. 5 is a side, external view of the electronic device of FIG. 4, in accordance with an example embodiment.

FIGS. 4 and 5 are top and side views of an alternate embodiment of an antenna-in-package electronic device 100' that includes an electronic circuit 180 coupled to first and second sidewall antennas 121, 122. In FIGS. 4 and 5, the same reference numbers are used for features that are identical to the same-numbered features of FIGS. 1-3, and the above description of those same-numbered features is incorporated into this description of FIGS. 4 and 5.

In the alternate embodiment of device 100' illustrated in FIGS. 4 and 5, rather than implementing shield structures (e.g., structures 150, FIGS. 1-3) with conductive vias (e.g., vias 152, FIGS. 1-3), each shield structure 150' instead includes a continuous conductive trench or wall that has a "bar-shaped" (e.g., rectangular) cross-section. In this example, each shield structure 150' is coupled to one or more conductive ground pads 127 at the upper surface 111 of the device substrate 110, and each shield structure 150' extends from the upper surface 111 toward or to the upper encapsulant surface 192. In some embodiments, the cross-section of device 100' in FIG. 4 along line 2-2 would appear substantially the same as the cross-section of device 100 of FIG. 1 along line 2-2, with shield structures 150' (FIGS. 4 and 5) replacing conductive vias 152 (FIG. 2).

The lateral sides of each shield structure 150' are completely surrounded by the encapsulant material 190, in some embodiments. Similar to vias 152 (FIGS. 1-3), each shield structure 150' has a height 159 that is at least as high as the height (not numbered) of the electronic circuit 180 (or at least those components of the electronic circuit 180 that are susceptible to electromagnetic interference). Further, in some embodiments, the height 159 of the shield structures 150' may be about equal to the height (not numbered) of the encapsulant material 190. The distal ends of the shield structures 150' are exposed at the upper encapsulant surface 192 (and thus exposed at the upper surface 106 of the device 100'). In other embodiments, the heights 159 of the shield structures 150' may be less than the height of the encapsulant 190, although not significantly less to avoid the phenomenon of signal energy from the antennas 121, 122 reflecting downward from the upper encapsulant surface 106 through the space between the upper encapsulant surface 106 and the tops of the shield structures 150'. For example, the difference in the heights of the encapsulant 190 and the shield structures 150' may be selected dependent on the bandwidth or frequency of operation of the device 100' (e.g., the difference in height may be less than lambda/8, where lambda is the wavelength associated with the frequency of operation of the device 100', or the lower bandwidth limit).

The length 453 (FIG. 4) of each shield structure 150' may be slightly shorter than the width 191 (FIG. 4) of the encapsulant material 190 between sidewalls 142 and 144 so that third portions 195 (FIG. 5) of the encapsulant material 190 are present between the lateral sides of the shield structures 150' and encapsulant sidewalls 142, 144. For example, the length 453 of each shield structure 150' may be in a range of about 400 microns to about 4000 microns.

According to one or more embodiments, a width 563 (FIG. 5) of the third portions 195 of the encapsulant material 190 may be selected to avoid a potential phenomenon of signal energy from the antennas 121, 122 reflecting inward from the encapsulant sidewalls 142, 144 through the space between the encapsulant sidewalls 142, 144 and the lateral sides of the shield structures 150'. For example, the selected width 563 may be in a range of about lambda/16 to about lambda/8 (i.e., less than or equal to lambda/8), where lambda is the wavelength associated with the frequency of operation of the device 100', or the lower bandwidth limit.

In various embodiments, each shield structure 150' may include a conductive wall that is built up upon or attached to the mounting surface 111 of the device substrate 110 (and more specifically to a ground pad 127) before the encapsulant material 190 is applied over the mounting surface 111 of the device substrate 110. In other embodiments, each shield structure 150' may consist of an elongated trench in the encapsulant material 190 that is lined or filled with conductive material.

As discussed above, and referring to all of the embodiments illustrated in FIGS. 1-5, the electronic circuit 180 is coupled to mounting surface 111 of the device substrate 110 between the shield structures 150 (or 150') and between the transmit and receive antennas 121, 122. More particularly, the electronic circuit 180 includes a plurality of terminals (e.g., first, second, third, and fourth terminals 181, 183, 184, 186, FIG. 2), which are physically and electrically coupled to corresponding circuitry pads (e.g., first, second, third, and fourth circuitry pads 123, 124, 125, 126, FIG. 2) at the mounting surface 111 of the device substrate 110. For example, as shown in FIG. 2, a first terminal 181 of the electronic circuit 180 is coupled to a first circuitry pad 123 of the device substrate 110. Similarly, a second circuitry pad 124 is coupled to a second terminal 183, a third circuitry pad 125 is coupled to a third terminal 184, and a fourth circuitry pad 126 is coupled to a fourth terminal 186.

According to one or more embodiments, and as indicated above, the electronic circuit 180 may be a transceiver circuit that includes transmitter circuitry 182 and receiver circuitry 185. The terminals 181, 183, 184, 186 of the electronic circuit 180 are electrically coupled to the transmitter and receiver circuitry 182, 185. For example, the first terminal 181 may function as an input terminal to the transmitter circuitry 182, and the second terminal 183 may function as an output terminal from the transmitter circuitry 182. Further, the third terminal 184 may function as an input terminal to the receiver circuitry 185, and the fourth terminal 186 may function as an output terminal from the receiver circuitry 185.

According to an embodiment, the first circuitry pad 123 and the first terminal 181 of the electronic circuit 180 are electrically coupled through a conductive routing path 132 in the device substrate 110 to an input terminal 161 at the terminal surface 105 of the device 100, 100'. The second circuitry pad 124 and the second terminal 183 of the electronic circuit 180 are electrically coupled through another conductive routing path 133 in the device substrate 110 to the antenna pad 128 and, thus, to the transmit antenna 121. The third circuitry pad 125 and the third terminal 184 of the electronic circuit 180 are electrically coupled through yet another conductive routing path 134 in the device substrate 110 to the antenna pad 129 and, thus, to the receive antenna 122. Finally, the fourth circuitry pad 126 and the fourth terminal 186 of the electronic circuit 180 are electrically coupled through yet another conductive routing path 135 in the device substrate 110 to an output terminal 166 at the terminal surface 105 of the device 100, 100'.

During device operation, an input signal is conveyed from the input terminal 161 through the conductive path 132 to the first circuitry pad 123 and the first terminal 181, and the transmitter circuitry 182 may process (e.g., amplify) the input signal, and provide a processed (e.g., amplified) version of the signal to the second terminal 183. This signal, in turn, may be conveyed from the second circuitry pad 124 and conductive routing path 133 to the transmit antenna 121, which then radiates the signal over the air as a transmit RF signal within radiation pattern 187.

Conversely, during device operation, a receive RF signal with sufficient power within radiation pattern 189 may impinge upon the receive antenna 122. The receive antenna 122 may convert the receive RF signal to an electrical signal that is conveyed from the receive antenna 122 through the conductive routing path 134 to the third circuitry pad 125 and the third terminal 184 of the electronic circuit 180. The receiver circuitry 185 may then process (e.g., filter and amplify) the signal, and may provide a processed (e.g., filtered and amplified) version of the signal to the fourth terminal 186. This signal, in turn, may be conveyed from the fourth circuitry pad 126 and the conductive routing path 135 to the output terminal 166 of the device 100, 100'.

The electronic circuit 180 is depicted in the drawings as an integrated circuit (IC) device that includes terminals (e.g., terminals 181, 183, 184, 186) that are coupled to corresponding conductive pads (e.g., pads 123, 124, 125, 126) at the mounting surface 111 of the device substrate 110. The IC device may be a flip-chip, ball grid array (BGA) device, which, in some embodiments, includes transmitter circuitry 182 and receiver circuitry 185. In other embodiments, the electronic circuit 180 may be implemented with multiple ICs and/or discrete components, at least some of which are coupled to the mounting surface 111 of the device substrate 110.

Although the illustrated embodiments of devices 100, 100' each include one instance of transmitter circuitry 182 coupled to a single transmit antenna 121, and one instance of receiver circuitry 185 coupled to a single receive antenna 122, other embodiments may include only one instance of either the transmitter or receiver circuitry 182, 185, and accordingly only one of either the transmit antenna 121 or the receive antenna 122. In still other embodiments, a device may include multiple transmit antennas 121 and/or multiple receive antennas 122, which may enable multiple-input, multiple-output (MIMO) operation.

As discussed above, the transmit and receive antennas 121, 122 may include one or more types of planar, end-fire antennas on the encapsulant sidewalls (e.g., on sidewalls 141, 143, FIG. 2), which are configured to support radiation patterns 187, 189 with main lobes that extend substantially upward, as indicated by arrows 196 in FIG. 2. For example, either or both of the transmit and receive antennas 121, 122 may be selected from a planar Yagi-Uda antenna (as shown in FIGS. 3 and 5), a planar log periodic dipole antenna (LPDA), a planar Vivaldi (tapered slot) antenna, or another suitable planar, end-fire antenna.

Figure 6:
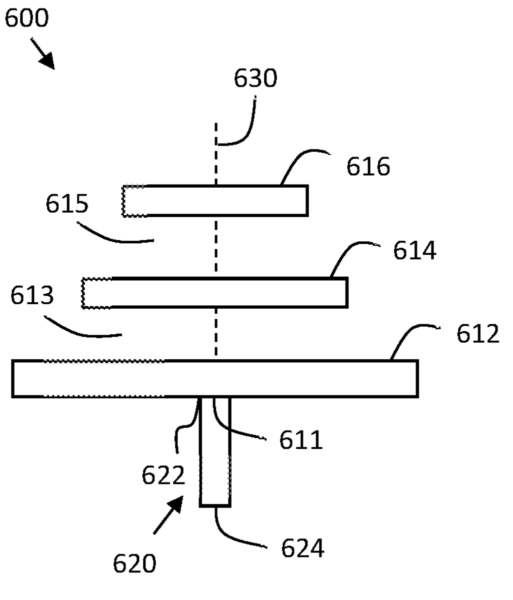
FIG. 6 is an example of a planar Yagi-Uda antenna, in accordance with an example embodiment.

Referring now to FIG. 6, a non-limiting example of a planar, Yagi-Uda antenna 600 is shown, which may be coupled to one or more of the encapsulant sidewalls (e.g., to sidewalls 141, 143) and used for either or both of the transmit and receive antennas 121, 122. According to an embodiment, the planar Yagi-Uda antenna 620 is a three-element antenna that includes an array of three parallel resonant antenna elements 612, 614, 616 (e.g., microstrip dipole elements) arranged in an antenna layout. In other embodiments, a suitable Yagi-Uda antenna may include more than three antenna elements 612, 614, 616. Either way, centers of the antenna elements 612, 614, 616 are aligned with each other along a central axis 630, and the antenna elements 612, 614, 616 are physically and electrically separated from each other by non-conductive gaps 613, 615. The length (horizontal dimension in FIG. 6) of each antenna element 612, 614, 616 is substantially greater than the width (vertical dimension in FIG. 6) of each antenna element 612, 614, 616. According to one or more embodiments, each of the antenna elements 612, 614, 616 is formed from a relatively-thin stack of conductive material layers (e.g., comprising layers of copper, nickel, gold, and/or other suitable materials).

According to one or more embodiments, the antenna elements 612, 614, 616 include a driven element 612 and two director elements 614, 616. The length of the driven element 612 is relatively long, and the lengths of the director elements 614, 616 become shorter, the farther the element 614, 616 is from the driven element 612. The director elements 614, 616 are positioned, relative to the driven element 612, in the intended direction of the radiation patterns (e.g., in directions indicated by arrows 196, FIG. 2).

The director element 612 has a feed point 611 that is coupled to a proximal end 622 of a microstrip feed structure 620. When integrated into a device (e.g., device 100, 100', FIGS. 1-5), a distal end 624 of the microstrip feed structure 620 is coupled to an antenna pad (e.g., one of antenna pads 128, 129, FIG. 2). When the above-described Yagi-Uda antenna 600 is used in one of the above-described devices 100, 100' (FIGS. 1-5), the shield structure (e.g., shield structure 150, 150') functions as a ground plane for the antenna 600.

Although the Yagi-Uda antenna 600 described above has a particular arrangement of microstrip dipole elements 612, 614, 616, the various elements may be differently arranged. For example, the driven element may be located between a reflector element and one or more director elements, according to other embodiments. Other variations also could be made.

As also described above, according to one or more alternate embodiments, the transmit and receive antennas 121, 122 may include one or more types of planar, broadside-fire antennas on the encapsulant sidewalls (e.g., on sidewalls 141, 143, FIG. 2), which are configured to support radiation patterns with main lobes that extend substantially perpendicularly from the encapsulant sidewalls, as indicated by arrows 197, 198 in FIG. 2. For example, either or both of the transmit and receive antennas 121, 122 may be selected from a patch antenna, a slot antenna, a dipole antenna, a ring antenna, a spiral antenna, a bow tie antenna, or another suitable planar, broadside-fire antenna.

Figure 7:
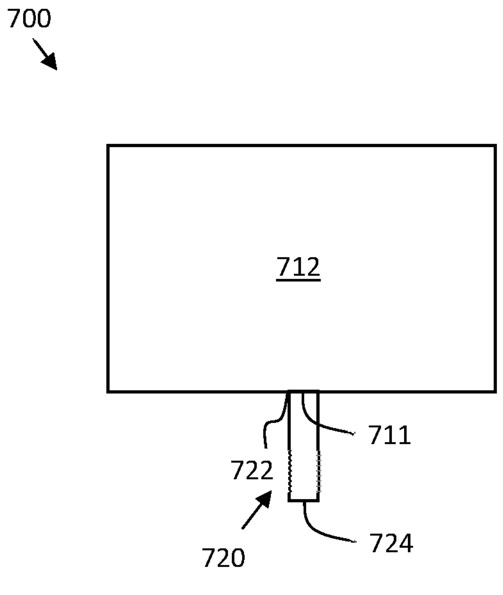
FIG. 7 is an example of a planar patch antenna, in accordance with an example embodiment.

Referring now to FIG. 7, a non-limiting example of a planar patch antenna 720 is shown, which may be coupled to one or more of the encapsulant sidewalls (e.g., to sidewalls 141, 143) and used for either or both of the transmit and receive antennas 121, 122. According to an embodiment, the planar patch antenna 720 includes a planar microstrip element 712, formed from a relatively-thin stack of conductive material layers (e.g., comprising layers of copper, nickel, gold, and/or other suitable materials) with a rectangular antenna layout. In other embodiments, the shape of the antenna layout for the patch antenna 720 may be different (e.g., round, hexagonal, triangular, etc.).

A feed point 711 along one edge of the microstrip element 712 is coupled to a proximal end 722 of a microstrip feed structure 720. When integrated into a device (e.g., device 100, 100', FIGS. 1-5), a distal end 724 of the microstrip feed structure 720 is coupled to an antenna pad (e.g., one of antenna pads 128, 129, FIG. 2). When the above-described patch antenna 700 is used in one of the above-described devices 100, 100' (FIGS. 1-5), the shield structure (e.g., shield structure 150, 150') functions as a ground plane for the antenna 700.

Embodiments of methods for fabricating the above-described embodiments of devices 100, 100' will now be described. More specifically, FIG. 8 is a flowchart of a method for fabricating the electronic devices 100, 100' (FIGS. 1-5), in accordance with one or more example embodiments. For enhanced understanding, small depictions of partially formed devices during the various fabrication stages are shown to the right of each corresponding flowchart block.

It should be mentioned here that devices 100, 100' may be fabricated individually. More likely, however, multiple instances of the devices 100, 100' may be fabricated simultaneously in a strip or panel form, where the individual devices 100, 100' are separated from the strip or panel (i.e., singulated) during a later fabrication step (e.g., in conjunction with block 812). For ease of illustration, FIG. 8 depicts two devices that are formed in parallel in a strip that includes two device areas 801. Those of skill in the art would understand, based on the description herein, how to form a single individual device, how to form a strip of more than two devices, and how to form a panel of devices.

The method begins, in block 802, by mounting electronic circuits 180 to the mounting surface 111 of a device substrate panel 803 within each device area 801. According to an embodiment, the device substrate panel 803 may be a multi-layer PCB, which includes multiple patterned conductive layers (e.g., layers 113-116, FIG. 2) separated by multiple dielectric layers (e.g., layers 117-119, FIG. 2). In other embodiments, the device substrate panel 803 may be another suitable substrate other than a PCB. Conductive vias (not numbered), may extend through the dielectric layers 117-119 to connect various sets of conductive features within adjacent conductive layers 113-116. Within each device area 801, a first patterned conductive layer (e.g., layer 113) of the device substrate panel 803 may include a plurality of conductive features on or exposed at the mounting surface 111 of the device substrate panel 803. For example, in each device area 801, the first patterned conductive layer may include conductive features that correspond to conductive circuitry pads (e.g., pads 123, 124, 125, 126, FIG. 2). The first patterned conductive layer also may include conductive features that correspond to ground terminals (e.g., ground terminals 127, FIG. 2), antenna terminals (e.g., antenna terminals 128, 129, FIG. 2), and antenna ground planes (e.g., antenna ground planes 130, FIG. 2).

During the process of mounting the electronic circuits 180 onto the device substrate panel 803, corresponding terminals (e.g., terminals 181, 183, 184, 186, FIG. 2) of each electronic circuit 180 are physically and electrically coupled to the conductive circuitry pads (e.g., pads 123, 124, 125, 126). For example, the circuitry pads and device terminals may be coupled together using solder, electrically conductive adhesive, or other suitable materials.

In block 804, shield structures (e.g., shield structures 150, 150', FIGS. 1-5) are then formed on or coupled to the mounting surface 111 of the device substrate 110 within each device area 801. According to some embodiments, conductive posts or a conductive wall (corresponding to vias 152 of structure 150 or corresponding to the conductive wall of structure 150', FIGS. 1-5) are connected to or built up on the ground pads 127. For example, the conductive posts or the conductive walls may be formed from copper or one or more other electrically-conductive materials.

In block 806, the electronic circuit 180 and the shield structures 150, 150' are then encapsulated by applying encapsulant material 190 over the electronic circuits 180, over the shield structures 150, 150', and over the mounting surface 111 of the device substrate panel 803. Said another way, the encapsulant material 190 is coupled to the mounting surface 111. The height of the encapsulant material 190 should be sufficient to cover the electronic circuits 180 and the shield structures 150, 150'.

In various embodiments, the encapsulant material 190 may include one or more epoxy molding compounds (EMC) or other suitable materials, which may be molded (e.g., compression or injection molded) or dispensed (e.g., screen printed) over the electronic circuits 180, the shield structures 150, 150', and the mounting surface 111. Unless a subsequent grinding or polishing process is performed to thin the encapsulant material 190, the upper surface of the encapsulant material 190 corresponds to the upper surface 106 of the partially-formed device.

According to one or more further embodiments, the encapsulant material 190 may include a thermosetting mold compound material that supports a laser direct structuring (LDS) process, which later may be used (e.g., in block 810) to form sidewall antennas (e.g., antennas 121, 122), as will be described below. For example, the encapsulant material 190 may include a polymer and an additive (e.g., 3 valent copper), which is configured to be activated by laser ablation (e.g., by thermal energy from a laser beam 811, as discussed below).

In block 808, a partial cutting process is then performed to form openings 809 in the encapsulant material 190 that expose portions of the mounting surface 111 of the device substrate panel 803. This results in the exposure of the antenna pads 128, 129 and the antenna ground planes 130, while also defining the encapsulant sidewalls (e.g., sidewalls 141-144, FIGS. 1-5).

In block 810, the planar transmit and receive antennas 121, 122 are then formed on the encapsulant sidewalls 141, 143, with distal ends of the antenna feeds (e.g., ends 624, 724 of feeds 620, 720, FIGS. 6, 7) being connected to the antenna pads 128, 129. According to one or more embodiments, as mentioned above, the encapsulant material 190 may include a thermosetting mold compound material with a special additive (e.g., 3 valent copper), and the antennas 121, 122 may be formed using an LDS process. More specifically, a laser activation process is performed, in which angled laser beams (e.g., laser beam 811) are sequentially directed toward the encapsulant sidewalls 141, 143 in order to write (or transfer) the layouts of the antennas 121, 122 onto the encapsulant sidewalls 141, 143. Thermal energy from the laser beams 811 activates the additive in the encapsulant material 190, which results in plateable antenna patterns on the encapsulant sidewalls 141, 143. For example, when the additive is 3 valent copper, a chemical reaction may occur (e.g., at about 1000 degrees Celsius) in which the 3 valent copper is converted to bulk copper, which may act as a catalyst at the encapsulant sidewalls 141, 143 for subsequent electroless plating (e.g., of copper), as described below. The plateable antenna patterns are formed by the laser beam 811 as micro-rough surfaces on which conductive material (e.g., bulk copper) is firmly anchored.

On their own, the plateable antenna patterns may not be electrically conductive. Accordingly, in conjunction with one or more embodiments, the laser ablation process is followed by the performance of an electroless plating process, which results in metallization (e.g., copper) being applied onto the plateable antenna patterns. For example, the partially-formed devices may be submerged in copper baths, resulting in copper being additively built-up (e.g., in a range of 8 to 12 microns/hour) on the plateable antenna patterns. According to one or more embodiments, additional metal layers (e.g., one or more layers of nickel and/or gold) may be applied over the plated copper layers. In some embodiments, one or more layers of tin, silver, palladium/gold, or other materials also or alternatively may be formed as constituent parts of the sidewall antennas 121, 122.

Although the above-described LDS process may be used to form the sidewall antennas 121, 122 on the encapsulant sidewalls 141, 143, other methods alternatively may be used to form the sidewall antennas 121, 122. For example, the patterns for the sidewall antennas 121, 122 alternatively may be formed by printing conductive material layers (e.g., copper, nickel, gold, etc.) on the encapsulant sidewalls 141, 143. This may be most conveniently performed after singulation of the devices 100, 100' as described in the next fabrication step.

In block 812, the individual devices 100, 100' are singulated from the device substrate panel 803 along the saw streets 813. For example, a sawing process may be performed to separate the devices 100, 100' and to define the substrate sidewalls (e.g., sidewalls 101-104). Fabrication of the devices 100, 100' is then complete.

Optionally, conductive attachment material (e.g., solder balls 170) then may be applied to the device terminals (e.g., terminals 160, 161, 166). At this stage, formation of the device 100, 100' is complete. When the device has been formed in a strip or panel with other devices (not shown), a device singulation process may be performed to separate the devices into discrete units. The method may then end.

Figure 8:
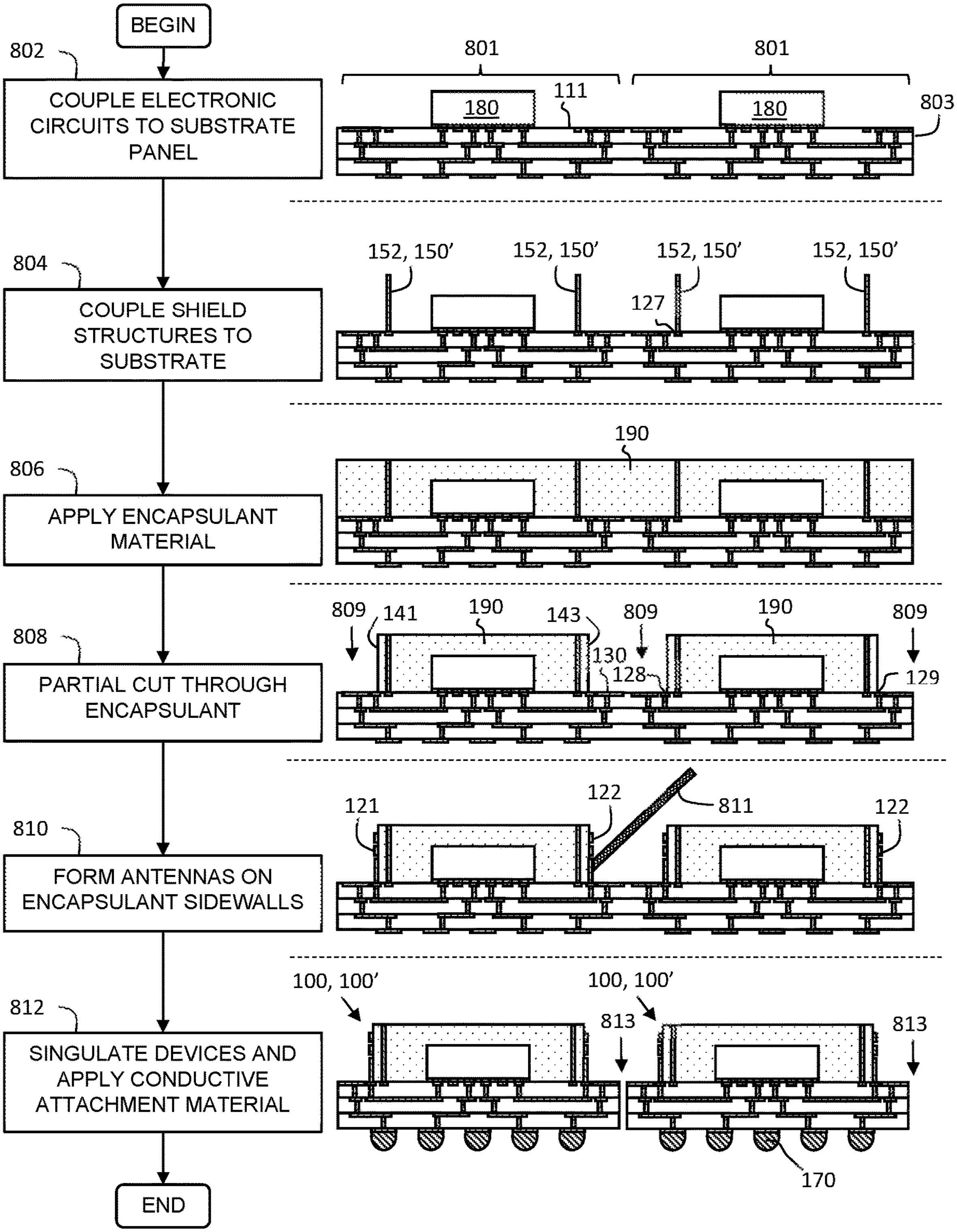
FIG. 8 is a flowchart of a method for fabricating the electronic device embodiments of FIGS. 1-5, in accordance with an example embodiment.

The fabrication method described in conjunction with FIG. 8 includes providing the device substrate 110 (or a panel 803 thereof) in the form of a multiple-layer PCB or other suitable structure. In other embodiments, the device substrate 110 may be formed as an RDL structure.

Alternate embodiments of fabricating devices 100, 100' could be used, rather than the process depicted in FIG. 8. For example, an alternative method of fabrication could include coupling multiple instances of an electronic circuit 180 (FIGS. 2, 4) to the upper surface of a temporary carrier, and encapsulating each electronic circuit 180 with encapsulant material 190 (FIGS. 2, 4). The partially-formed device could then be removed from the temporary carrier, and openings for the conductive vias (e.g., vias 152, FIGS. 1-3) or conductive trench (e.g., structure 150', FIGS. 4, 5) could be formed in the encapsulant material 190 (e.g., using laser drilling or other suitable techniques). The depths of the via or trench openings may be controlled through control of the energy and/or time associated with the laser drilling process. The depths of the via or trench openings correspond to the ultimate heights (e.g., heights 159, 559, FIGS. 2, 5) of the to-be-formed conductive vias or conductive trenches. In some cases, the via or trench openings may be drilled all the way through the upper surface 192 (FIGS. 2, 3, 5) of the encapsulant material 190, although these via or trench openings may stop short of the upper surface 192, as well.

Electrically conductive material then may be applied in the via openings or trench openings in order to form the vias (e.g., vias 152, FIGS. 1-3) or the conductive trench (e.g., structure 150', FIGS. 4, 5). For example, the via or trench openings may be plated with copper or another conductive metal, or the via or trench openings may be filled with electrically conductive epoxy or another conductive material.

The device substrate 110 (FIG. 2) then may be build up on the surface of the encapsulant material 190 at which the electronic circuit 180 is exposed. For example, the device substrate 110 may be formed as a redistribution layer (RDL) structure using appropriate techniques. For example, in one or more embodiments, forming the device substrate 110 may include forming a first patterned conductive layer (e.g., layer 113, FIG. 2) over the exposed surfaces of the encapsulant 190, the electronic circuit 180, and the proximal ends of the conductive vias or trenches. For example, the first patterned conductive layer may include circuitry pads (e.g., pads 123-126, FIG. 2) in contact with the terminals (e.g., terminals 181, 183, 184, 186, FIG. 2) of the electronic circuit 180, ground pads (e.g., pads 127, FIG. 2) in contact with proximal ends of the vias or trenches (and thus in contact with the shield structures 150, 150', FIGS. 1-5), antenna pads (e.g., pads 128, 129, FIG. 2), and antenna ground planes (e.g., ground planes 130, FIGS. 1-5) overlying sacrificial portions of the encapsulant material 190.

A first dielectric layer (e.g., layer 117, FIG. 2) then may be formed over the first patterned conductive layer, and openings may be formed through the first dielectric layer to expose the circuitry pads 123-126, the ground pads 127, the antenna pads 128, and the antenna ground planes 130. The first dielectric layer and the first patterned conductive layer define the mounting surface (e.g., mounting surface 111, FIG. 2) of the device substrate 110. An iterative process of forming subsequent patterned conductive layers (e.g., layers 114-116, FIG. 2) interleaved with subsequent dielectric layers (e.g., layers 118, 119, FIG. 2) may then be performed to complete formation of the device substrate 110. Upon completion, a plurality of conductive device terminals (e.g., terminals 160, 161, 166, FIG. 2) are exposed at the terminal surface (e.g., surface 112, FIG. 2) of the device substrate 110. Fabrication of the device 100, 100' may then proceed according to blocks 808 through 812 of FIG. 8.

An embodiment of an electronic device includes a device substrate with a mounting surface, an electronic circuit coupled to the mounting surface, and encapsulant material over the electronic circuit and the mounting surface. The encapsulant material is defined by an upper encapsulant surface and a plurality of encapsulant sidewalls extending between the mounting surface of the device substrate and the upper encapsulant surface. The electronic device also includes a sidewall antenna coupled to a first encapsulant sidewall of the plurality of encapsulant sidewalls, and a shield structure embedded within the encapsulant material between the sidewall antenna and the electronic circuit. The sidewall antenna is electrically coupled to the electronic circuit through the device substrate. The shield structure extends in a perpendicular direction from the mounting surface of the device substrate toward the upper surface of the encapsulant material.

According to a further embodiment, the device substrate also includes a second surface and a plurality of substrate sidewalls that extend between the mounting surface and the second surface, and the first encapsulant sidewall and a first substrate sidewall of the plurality of substrate sidewalls are oriented in parallel planes. The first encapsulant sidewall is recessed from the first substrate sidewall to define an exposed portion of the mounting surface between the first encapsulant sidewall and the first substrate sidewall, and the electronic device further comprises an antenna ground plane at or below the exposed portion of the mounting surface. The antenna ground plane is configured to act as an antenna back stop.

According to another further embodiment, the encapsulant material includes a first portion of encapsulant material between the shield structure and the first encapsulant sidewall, a second portion of encapsulant material between the shield structure and the electronic circuit, and third portions of encapsulant material between the shield structure and other encapsulant sidewalls of the plurality of encapsulant sidewalls, where the other encapsulant sidewalls are adjacent to the first encapsulant sidewall.

According to yet another further embodiment, the sidewall antenna is a planar end-fire type of antenna, which is configured to support a radiation pattern with a main lobe that extends upward in a direction that is parallel to the first encapsulant sidewall. For example, the sidewall antenna may be an antenna selected from a planar Yagi-Uda antenna, a planar log periodic dipole antenna, and a planar Vivaldi antenna.

According to yet another further embodiment, the sidewall antenna is a planar broadside-fire type of antenna, which is configured to support a radiation pattern with a main lobe that extends laterally in a direction that is perpendicular to the first encapsulant sidewall. For example, the sidewall antenna may be an antenna selected from a patch antenna, a slot antenna, a dipole antenna, a ring antenna, a spiral antenna, and a bow tie antenna.

An embodiment of a method of fabricating an electronic device includes coupling an electronic circuit to a mounting surface of a device substrate, coupling a shield structure to the mounting surface of the device substrate, and applying encapsulant material over the electronic circuit and the mounting surface. The encapsulant material is defined by an upper encapsulant surface and a plurality of encapsulant sidewalls extending between the mounting surface of the device substrate and the upper encapsulant surface, and the encapsulant material surrounds lateral sides of the shield structure. The method further includes forming a sidewall antenna on a first encapsulant sidewall of the plurality of encapsulant sidewalls. The sidewall antenna is electrically coupled to the electronic circuit through the device substrate. The shield structure is embedded within the encapsulant material between the sidewall antenna and the electronic circuit, and the shield structure extends in a perpendicular direction from the mounting surface of the device substrate toward the upper surface of the encapsulant material.

According to a further embodiment, the encapsulant material includes a polymer and an additive that is configured to be activated by laser ablation, and forming the sidewall antenna on the first encapsulant sidewall includes directing a laser beam toward the first encapsulant sidewall to form a plateable antenna pattern associated with the sidewall antenna onto the first encapsulant sidewall, and performing an electroless plating process to apply metallization onto the plateable antenna pattern.

According to a further embodiment, the sidewall antenna is selected from a planar end-fire type of antenna that is configured to support a first radiation pattern with a first main lobe that extends upward in a direction that is parallel to the first encapsulant sidewall, and a planar broadside-fire type of antenna that is configured to support a second radiation pattern with a second main lobe that extends laterally in a direction that is perpendicular to the first encapsulant sidewall.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An electronic device comprising:

a device substrate with a mounting surface;

an electronic circuit coupled to the mounting surface;

encapsulant material over the electronic circuit and the mounting surface, wherein the encapsulant material is defined by an upper encapsulant surface parallel to the mounting surface, and a plurality of encapsulant sidewalls extending between the mounting surface of the device substrate and the upper encapsulant surface;

a first sidewall antenna on a first encapsulant sidewall of the plurality of encapsulant sidewalls, wherein the first sidewall antenna is electrically coupled to the electronic circuit through the device substrate; and a first shield structure embedded within the encapsulant material between the first sidewall antenna and the electronic circuit, wherein the first shield structure extends from the mounting surface of the device substrate toward the upper surface of the encapsulant material.

2. The electronic device of claim 1, wherein:

the device substrate further includes a second surface and a plurality of substrate sidewalls that extend between the mounting surface and the second surface;

the first encapsulant sidewall and a first substrate sidewall of the plurality of substrate sidewalls are oriented in parallel planes;

the first encapsulant sidewall is recessed from the first substrate sidewall to define an exposed portion of the mounting surface between the first encapsulant sidewall and the first substrate sidewall; and the electronic device further comprises an antenna ground plane at or below the exposed portion of the mounting surface, wherein the antenna ground plane is configured to act as an antenna back stop.

3. The electronic device of claim 2, further comprising:

a conductive antenna pad at the mounting surface of the device substrate, wherein the first sidewall antenna is electrically coupled to the conductive antenna pad; and a non-conductive gap between the conductive antenna pad and the antenna ground plane.

4. The electronic device of claim 1, wherein:
a height of the first shield structure is at least as high as a height of the electronic circuit; and
a length of the first shield structure is shorter than a width of the encapsulant material between second and third encapsulant sidewalls that are adjacent to the first encapsulant sidewall.

5. The electronic device of claim 1, further comprising:
at least one ground pad at the mounting surface of the device substrate,
wherein the first shield structure comprises a plurality of conductive vias electrically coupled to the at least one ground pad.

6. The electronic device of claim 5, wherein:
adjacent vias of the plurality of conductive vias are separated by an inter-via spacing that is less than lambda/8, where lambda is a wavelength associated with a frequency of operation of the electronic device.

7. The electronic device of claim 1, further comprising:
at least one ground pad at the mounting surface of the device substrate,
wherein the first shield structure comprises a conductive wall electrically coupled to the at least one ground pad.

8. The electronic device of claim 1, wherein the encapsulant material comprises:
a first portion of encapsulant material between the first shield structure and the first encapsulant sidewall;
a second portion of encapsulant material between the first shield structure and the electronic circuit; and
third portions of encapsulant material between the first shield structure and other encapsulant sidewalls of the plurality of encapsulant sidewalls, where the other encapsulant sidewalls are adjacent to the first encapsulant sidewall.

9. The electronic device of claim 1, wherein the first sidewall antenna is a planar end-fire type of antenna, which is configured to support a radiation pattern with a main lobe that extends upward in a direction that is parallel to the first encapsulant sidewall.

10. The electronic device of claim 9, wherein the first sidewall antenna is an antenna selected from a planar Yagi-Uda antenna, a planar log periodic dipole antenna, and a planar Vivaldi antenna.

11. The electronic device of claim 1, wherein the first sidewall antenna is a planar broadside-fire type of antenna, which is configured to support a radiation pattern with a main lobe that extends laterally in a direction that is perpendicular to the first encapsulant sidewall.

12. The electronic device of claim 11, wherein the first sidewall antenna is an antenna selected from a patch antenna, a slot antenna, a dipole antenna, a ring antenna, a spiral antenna, and a bow tie antenna.

13. The electronic circuit of claim 1, further comprising:
a second sidewall antenna coupled to a second encapsulant sidewall of the plurality of encapsulant sidewalls, wherein the second sidewall antenna is electrically coupled to the electronic circuit through the device substrate; and
a second shield structure embedded within the encapsulant material between the second sidewall antenna and the electronic circuit, wherein the second shield structure extends from the mounting surface of the device substrate toward the upper surface of the encapsulant material.

14. The electronic circuit of claim 13, wherein:
the electronic circuitry includes transmitter circuitry and receiver circuitry;
the electronic circuit further comprises a first conductive antenna pad and a second conductive mounting pad at the mounting surface of the device substrate;
the first sidewall antenna is electrically coupled to the first conductive antenna pad;
the second sidewall antenna is electrically coupled to the second conductive antenna pad;
the first conductive antenna pad is electrically coupled to the transmitter circuitry of the electronic circuitry through a first conductive routing path in the device substrate; and
the second conductive antenna pad is electrically coupled to the receiver circuitry of the electronic circuitry through a second conductive routing path in the device substrate.

15. The electronic device of claim 1, wherein:
the device substrate further includes a terminal surface at which a plurality of conductive device terminals are exposed;
the electronic circuitry is electrically coupled to a first device terminal of the plurality of device terminals; and
the first shield structure is electrically coupled to a second device terminal of the plurality of device terminals.

16. A method of fabricating an electronic device, the method comprising:
coupling an electronic circuit to a mounting surface of a device substrate;
coupling a first shield structure to the mounting surface of the device substrate;
applying encapsulant material over the electronic circuit and the mounting surface, wherein the encapsulant material is defined by an upper encapsulant surface parallel to the mounting surface, and a plurality of encapsulant sidewalls extending between the mounting surface of the device substrate and the upper encapsulant surface, and wherein the encapsulant material surrounds lateral sides of the first shield structure; and
forming a first sidewall antenna on a first encapsulant sidewall of the plurality of encapsulant sidewalls, wherein the first sidewall antenna is electrically coupled to the electronic circuit through the device substrate, wherein the first shield structure is embedded within the encapsulant material between the first sidewall antenna and the electronic circuit, and wherein the first shield structure extends from the mounting surface of the device substrate toward the upper surface of the encapsulant material.

17. The method of claim 16, wherein:
the encapsulant material includes a polymer and an additive that is configured to be activated by laser ablation; and
forming the first sidewall antenna on the first encapsulant sidewall includes
directing a laser beam toward the first encapsulant sidewall to form a plateable antenna pattern associated with the first sidewall antenna onto the first encapsulant sidewall, and
performing an electroless plating process to apply metallization onto the plateable antenna pattern.

18. The method of claim 16, wherein:
the device substrate further includes a second surface and a plurality of substrate sidewalls that extend between the mounting surface and the second surface;

the first encapsulant sidewall and a first substrate sidewall of the plurality of substrate sidewalls are oriented in parallel planes;

the first encapsulant sidewall is recessed from the first substrate sidewall to define an exposed portion of the mounting surface between the first encapsulant sidewall and the first substrate sidewall; and the method further includes forming an antenna ground plane at or below the exposed portion of the mounting surface, wherein the antenna ground plane is configured to act as an antenna back stop.

19. The method of claim 16, further comprising:

coupling a second shield structure to the mounting surface of the device substrate;

forming a second sidewall antenna on a second encapsulant sidewall of the plurality of encapsulant sidewalls, wherein the second sidewall antenna is electrically coupled to the electronic circuit through the device substrate, wherein the second shield structure is embedded within the encapsulant material between the second sidewall antenna and the electronic circuit, and wherein the second shield structure extends from the mounting surface of the device substrate toward the upper surface of the encapsulant material.

20. The method of claim 16, wherein:

the first sidewall antenna is selected from a planar end-fire type of antenna that is configured to support a first radiation pattern with a first main lobe that extends upward in a direction that is parallel to the first encapsulant sidewall, and a planar broadside-fire type of antenna that is configured to support a second radiation pattern with a second main lobe that extends laterally in a direction that is perpendicular to the first encapsulant sidewall.

* * * * *